US012073880B2

(12) United States Patent
Kern et al.

(10) Patent No.: US 12,073,880 B2
(45) Date of Patent: Aug. 27, 2024

(54) ACCESS TO A MEMORY

(71) Applicant: Infineon Technologies AG, Neubiberg (DE)

(72) Inventors: Thomas Kern, Aschheim (DE); Sebastian Kiesel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 17/844,785

(22) Filed: Jun. 21, 2022

(65) Prior Publication Data
US 2022/0406375 A1    Dec. 22, 2022

(30) Foreign Application Priority Data

Jun. 22, 2021    (DE) ..................... 10 2021 116 145.2

(51) Int. Cl.
| | | |
|---|---|---|
| *G11C 13/00* | (2006.01) | |
| *G11C 7/08* | (2006.01) | |
| *G11C 7/10* | (2006.01) | |

(52) U.S. Cl.
CPC .............. *G11C 13/004* (2013.01); *G11C 7/08* (2013.01); *G11C 7/1039* (2013.01);
(Continued)

(58) Field of Classification Search
CPC ..... G11C 7/06; G11C 11/1673; G11C 13/004; G11C 16/349; G11C 2013/0054; G11C 7/065; G11C 13/0004; G11C 13/0026; G11C 16/26; G11C 16/28; G11C 11/1655; G11C 13/0033; G11C 13/0035; G11C 13/0064; G11C 16/24; G11C 2013/0042; G11C 2013/0045; G11C 2013/0066;
(Continued)

(56) References Cited

U.S. PATENT DOCUMENTS 6,400,607 B1 * 6/2002 Pasotti ................... G11C 16/28
365/185.21
9,805,771 B2    10/2017 Loibl et al.
(Continued)

FOREIGN PATENT DOCUMENTS

DE    102018132503 A1    6/2020

OTHER PUBLICATIONS

Office action dated Jan. 5, 2022 for German Application No. 10 2021 116 145.2.

*Primary Examiner* — Thong Q Le
(74) *Attorney, Agent, or Firm* — Eschweiler & Potashnik, LLC

(57) ABSTRACT

In a method for accessing memory cells, a first read operation is performed on a first memory cell to read a first data value from the first memory cell. During the first read operation, a first variable current source provides a first assessment current having a first current level to a first bitline coupled to the first memory cell. A second read operation is performed on the first memory cell to read a second data value from the first memory cell. During the second read operation, the first variable current source manipulates the first current level to provide a second current level to the first bitline. A difference between the first current level and the second current level is based on whether the first data value that was read during the first read operation was a first data state or a second data state.

17 Claims, 14 Drawing Sheets

(52) U.S. Cl.
CPC ...... *G11C 13/0026* (2013.01); *G11C 13/0038* (2013.01); *G11C 13/0061* (2013.01); *G11C 13/0069* (2013.01); *G11C 2013/0054* (2013.01)

(58) Field of Classification Search
CPC ......... G11C 29/50; G11C 7/062; G11C 11/16; G11C 11/1659; G11C 11/4091; G11C 11/5642; G11C 13/00; G11C 13/0061; G11C 17/00; G11C 29/028; G11C 29/52; G11C 7/1006; G11C 11/161; G11C 11/1677; G11C 11/1693; G11C 11/5678; G11C 13/0038; G11C 13/0069; G11C 16/10; G11C 16/3427; G11C 2013/0057; G11C 2029/5006; G11C 2211/5634; G11C 2211/5642; G11C 29/12005; G11C 29/32; G11C 7/08; G11C 7/1039; G11C 7/1051; G11C 7/106
USPC .............. 365/185.2, 185.21, 189.11, 189.05, 365/189.07
See application file for complete search history.

(56) References Cited

U.S. PATENT DOCUMENTS

| | | |
|---|---|---|
| 9,991,000 B2 | 6/2018 | Calvetti et al. |
| 10,951,240 B2 | 3/2021 | Kern et al. |
| 2018/0068721 A1 | 3/2018 | Calvetti et al. |

\* cited by examiner

Fig.2

| Cell$_0$ | Cell$_1$ | Cell$_2$ | Cell$_3$ | Cell$_4$ | Cell$_5$ |
|---|---|---|---|---|---|
| HRS | HRS | HRS | LRS | LRS | LRS |
| HRS | HRS | LRS | HRS | LRS | LRS |
| HRS | LRS | HRS | HRS | LRS | LRS |
| LRS | HRS | HRS | HRS | LRS | LRS |
| HRS | HRS | LRS | LRS | HRS | LRS |
| HRS | LRS | HRS | LRS | HRS | LRS |
| ... | ... | ... | ... | ... | ... |
| LRS | LRS | HRS | LRS | HRS | HRS |
| LRS | LRS | LRS | HRS | HRS | HRS |

| Row no. | S5 | S4 | S3 | S2 | S1 | S0 |
|---|---|---|---|---|---|---|
| 1 | 1 | 1 | 1 | 0 | 0 | 0 |
| 2 | 1 | 1 | 0 | 1 | 0 | 0 |
| 3 | 1 | 0 | 1 | 1 | 0 | 0 |
| 4 | 0 | 1 | 1 | 1 | 0 | 0 |
| 5 | 1 | 1 | 0 | 0 | 1 | 0 |
| 6 | 1 | 0 | 1 | 0 | 1 | 0 |
| 7 | 0 | 1 | 1 | 0 | 1 | 0 |
| 8 | 1 | 0 | 0 | 1 | 1 | 0 |
| 9 | 0 | 1 | 0 | 1 | 1 | 0 |
| 10 | 0 | 0 | 1 | 1 | 1 | 0 |
| 11 | 1 | 1 | 0 | 0 | 0 | 1 |
| 12 | 1 | 0 | 1 | 0 | 0 | 1 |
| 13 | 0 | 1 | 1 | 0 | 0 | 1 |
| 14 | 1 | 0 | 0 | 1 | 0 | 1 |
| 15 | 0 | 1 | 0 | 1 | 0 | 1 |
| 16 | 0 | 0 | 1 | 1 | 0 | 1 |
| 17 | 1 | 0 | 0 | 0 | 1 | 1 |
| 18 | 0 | 1 | 0 | 0 | 1 | 1 |
| 19 | 0 | 0 | 1 | 0 | 1 | 1 |
| 20 | 0 | 0 | 0 | 1 | 1 | 1 |

Fig. 8

ACCESS TO A MEMORY

REFERENCE TO RELATED APPLICATIONS

This application claims priority to German Patent Application 10 2021 116 145.2, filed on Jun. 22, 2021. The contents of the above-referenced Patent Application is hereby incorporated by reference in its entirety.

TECHNICAL FIELD

The disclosure relates to access to memory, in particular using read operations to evaluate a robustness of a memory having a multiplicity of memory cells.

SUMMARY

Over time, memory cells of a memory device can degrade, resulting in the underlying characteristics of the memory cells changing over time. If left unaccounted for, these changes can result in data errors for bits of the memory device. It is thus possible for a test to be carried out for the memory cells of the memory device, on the basis of which the robustness or error tolerance of the memory device can be inferred.

Some aspects of the present disclosure relate to a method for determining robustness of memory cells, wherein each memory cell is configured to store a first data state and a second data state. In this method, a first read operation is performed on a first memory cell to read a first data value from the first memory cell. During the first read operation, a first variable current source provides a first assessment current to a first bitline that is coupled to the first memory cell. The first assessment current has a first current level. A second read operation is then performed on the first memory cell to read a second data value from the first memory cell. During the second read operation, the first variable current source manipulates the first current level to provide a second current level to the first bitline. A difference between the first current level and the second current level is based on whether the first data value read during the first read operation was the first data state or the second data state.

Some aspects of the present disclosure relate to a memory device including a memory cell and a sense amplifier. The sense amplifier includes a first input terminal, a second input terminal, and an output terminal. A bitline couples the memory cell to the first input terminal of the sense amplifier, and a reference bitline is coupled to the second terminal of the sense amplifier. A variable current source is coupled to the bitline. A memory cell robustness assessment circuit is coupled to a control terminal of the variable current source.

BRIEF DESCRIPTION OF THE DRAWINGS

The characteristics, features and advantages described above and the manner in which they are achieved will be further explained in detail in conjunction with the following schematic description of example embodiments which are explained with reference to the drawings. Elements which are the same or which produce the same effect can be denoted with the same reference numbers for the sake of clarity.

In the drawings:

FIG. 2 shows a table illustrating how 20 different states are represented on the basis of 6 memory cells Cell$_0$ to Cell$_5$;

FIG. 8 shows a truth table with the 20 possible codewords of the 3-from-6 code;

DESCRIPTION

The use of new memory device technologies such as MRAM, RRAM or PCRAM offers cost benefits and improves compatibility in relation to the CMOS manufacturing process.

However, coping with small read windows between the individual states, e.g. between 0-states and 1-states, poses a challenge.

Figure 1:
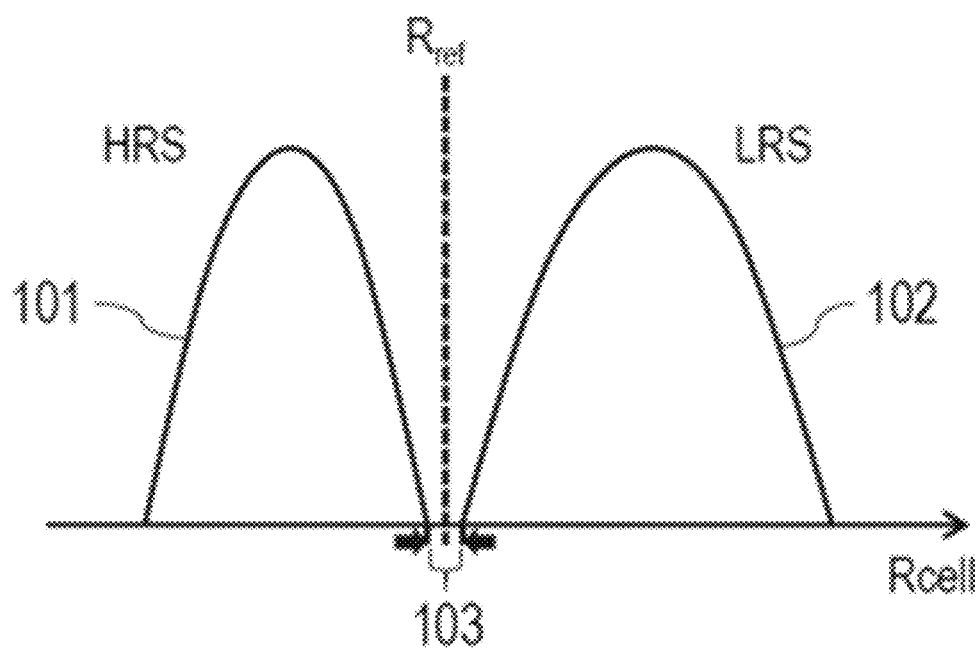
FIG. 1 shows an example of a diagram comprising two (frequency) distributions for cell resistances of memory cells.

FIG. 1 shows an example of a diagram comprising two (frequency) distributions 101 and 102 for cell resistances of memory cells between which a read window 103 is located. The distribution 101 shows, for example, a high resistive state (HRS) and the distribution 102 correspondingly shows, by way of example, a low resistive state (LRS). The read window 103 is arranged around a reference value $R_{ref}$.

A placement of the reference value $R_{ref}$ for separating the two distributions 101 and 102 is problematic with regard to the high reliability and robustness of the distinction of the states of the distributions 101 and 102. In addition, the clear distinction between HRS and LRS is hindered in that the memory cells change their characteristics through ageing and/or due to the effects of temperature. The size and/or position, for example, of the read window 103 can change as a result. As a result, it is also possible that the distributions 101 and 102 further draw closer or even overlap one another.

Complementary memory cells can be used to alleviate this problem. Two or more complementary memory cells, for example, can be used. In complementary memory cells, one data bit is represented by (at least) two physical memory cells which have complementary states in the error-free state. If two complementary memory cells A1 and A2, for example, are used in order to represent a logical data bit, the following can apply:

a logical value "0" occurs if the following applies to the complementary memory cells A1 and A2: A1=0 and A2=1.

a logical value "1" occurs if the following applies to the complementary memory cells A1 and A2: A1=1 and A2=0.

If no errors are present, the two memory cells A1 and A2 therefore always have complementary values: If the memory cell A1 has the value 0, the memory cell A2 has the value 1 and vice versa.

Complementary memory cells can be used e.g. for any k-from-n codes. The exemplary embodiment explained here describes an example of an implementation based on a 3-from-6 code. A codeword of the 3-from-6 code has 6 bits (states) of which 3 always have either the value 0 or the value 1 and the remaining 3 memory cells then have the corresponding complementary value.

Six physical memory cells, for example, can be provided which are used by means of a complementary approach to code e.g. 4 bits.

FIG. 2 shows a table illustrating how 20 different states are represented on the basis of 6 memory cells $Cell_0$ to $Cell_5$. Each of the memory cells can assume a high resistive state (HRS) or a low resistive state (LRS). Each of the states corresponds to a value assignment of these 6 memory cells $Cell_0$ to $Cell_5$ and also to a codeword of the 3-from-6 code.

For a k-from-n code, there are generally $$\binom{n}{k}$$

codewords which in each case have k first values and (n–k) second values. The following applies:

$$\binom{n}{k} = \frac{n!}{k! \cdot (n-k)!}$$

and thus for the 3-from-6 code:

$$\binom{6}{3} = \frac{6!}{3! \cdot (6-3)!} = \frac{6!}{3! \cdot 3!} = \frac{120}{6} = 20.$$

A total of 20 codewords therefore exist in the case of the 3-from-6 code, wherein three bits have a first value and the other three bits have a second value. These codewords can be used to map e.g. $2^4=16$ states (e.g., to code 4 bits), wherein 4 of the 20 codewords remain unused here.

Figure 3A:
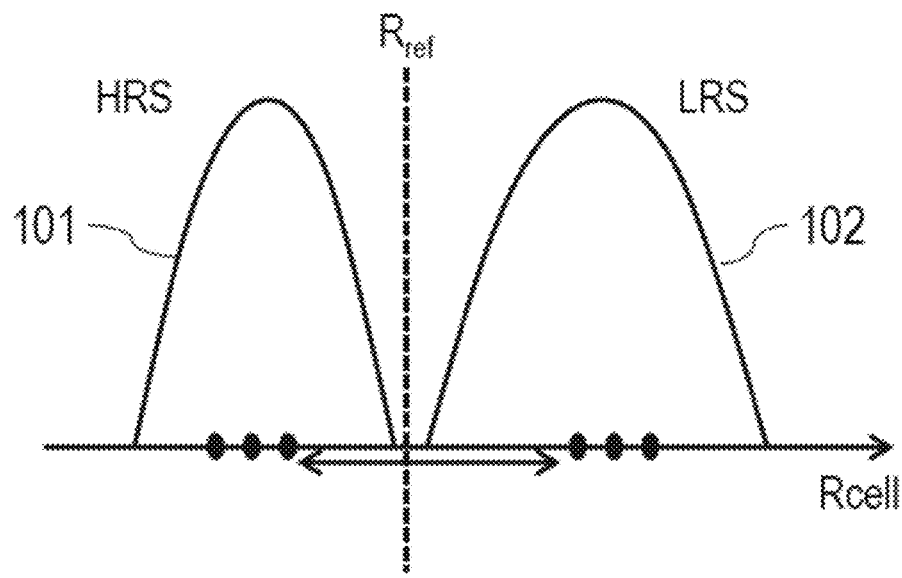
FIG. 3A shows an example of a diagram based on FIG. 1, wherein, in contrast to FIG. 1, resistance values Rcell of a total of 6 memory cells are plotted, wherein 3 memory cells have a low resistive state (LRS) and 3 memory cells have a high resistive state (HRS)

FIG. 3A shows an example of a diagram based on FIG. 1, wherein, in contrast to FIG. 1, resistance values Rcell of a total of 6 memory cells are plotted, wherein 3 memory cells have a low-resistance state (LRS) and 3 memory cells have a high-resistance state (HRS). As in FIG. 1 also, the x-axis shows the resistance value Rcell of the respective row.

Figure 3B:
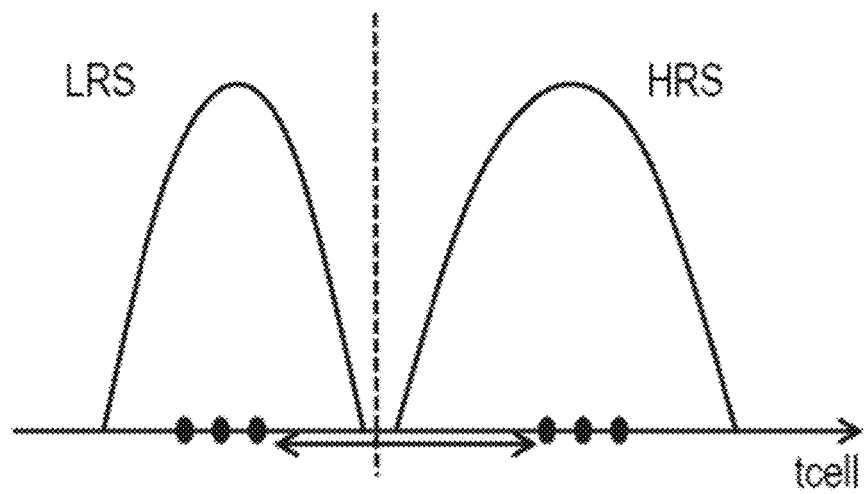
FIG. 3B shows an example of a diagram based on FIG. 3A following a transformation into the time domain.

FIG. 3B shows an example of a diagram based on FIG. 3A, wherein, in contrast to FIG. 3A, the x-axis shows a time tcell following a transformation into the time domain. The individual states of the memory cells are determined accordingly in a time-dependent manner.

The 0-state (e.g. the LRS), for example, can be measured more quickly than the 1-state (e.g. the HRS): if, therefore, according to the above example of the 3-from-6 code, the 0-state has been determined three times, it is then already established (in the case of an error-free measurement) in determining the third 0-state that the remaining three states not yet determined must be 1-states. The codeword can therefore already be determined early, as soon as only the three faster 0-states have been determined. There is no need to wait for the arrival of the slower 1-states.

It should be noted that it is assumed here by way of example that the 0-states can be determined on average before the 1-states. It essentially suffices if a first state can be determined more quickly than a second state.

Figure 4:
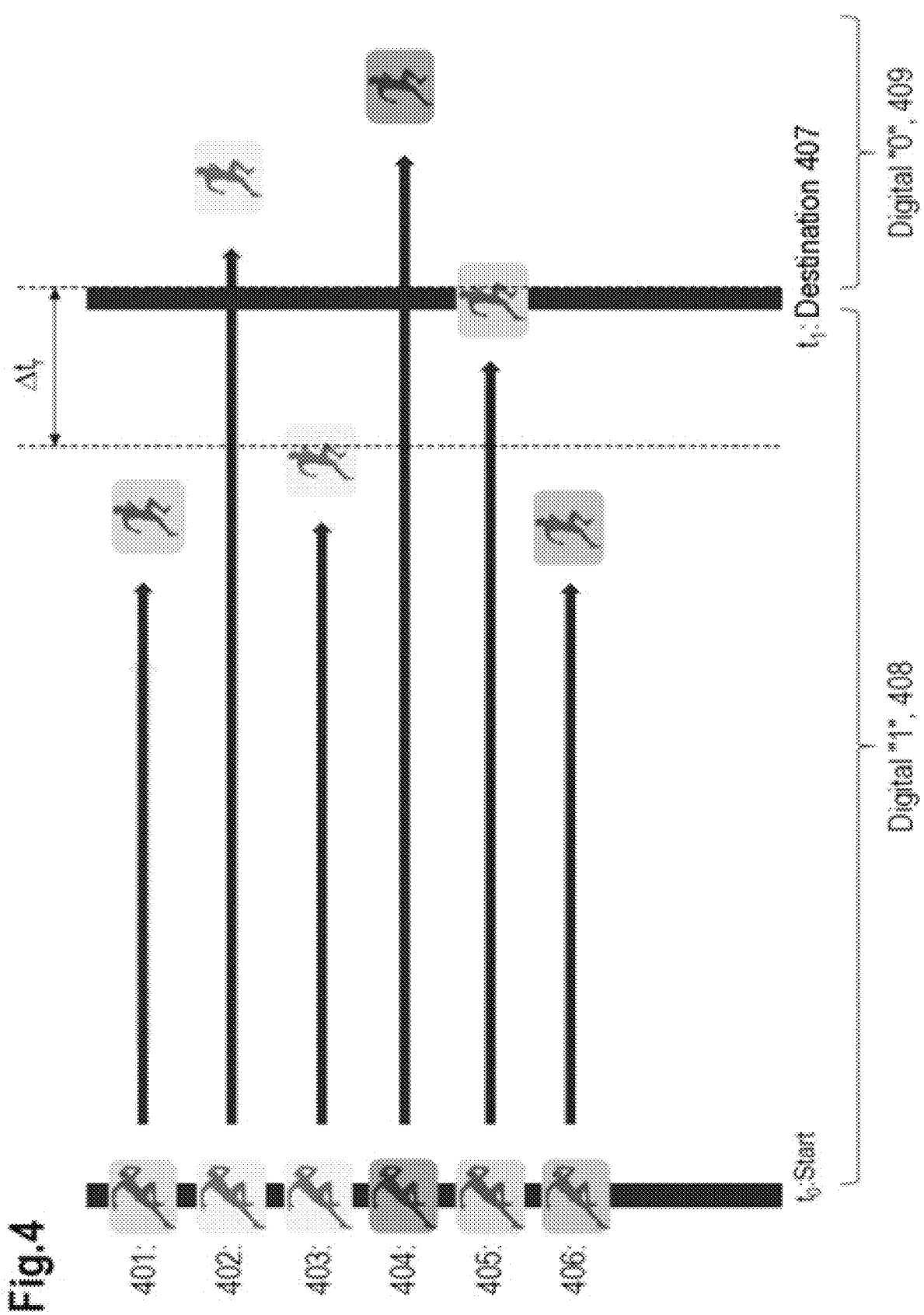
FIG. 4 shows a diagram illustrating, by way of example, the temporal measurement of the "0" and "1" states from memory cells.

FIG. 4 shows a diagram illustrating, by way of example, the temporal measurement of the "0" and "1" states. Each of the memory cells 401 to 406 represents one of these two states. In the example shown in FIG. 4, the following assignment of the memory cells applies by way of example:

Memory cell 401: State "1",
Memory cell 402: State "1",
Memory cell 403: State "1",
Memory cell 404: State "0",
Memory cell 405: State "0",
Memory cell 406: State "1".

As already explained, the 0-state corresponds, for example, to a low resistance value (LRS) according to the distribution 102, and the 1-state then corresponds to a high resistance value (HRS) according to the distribution 101. The LRS "0" can be determined earlier than the HRS "1" due to the transformation into the time domain.

A memory cell in the 0-state (having the value 0) has a lower resistance value than a memory cell in the 1-state (having the value 1), so that a higher current flows through the memory cell having a value 0. A voltage difference occurs if this current is integrated over time by means of a capacitor. This voltage difference increases more strongly over time and reaches a predefined threshold value significantly earlier than it would do if the memory cell had the value 1 and was correspondingly more highly resistive (and therefore a lower current would flow). Memory cells having the value 0 can consequently be determined earlier in time than memory cells having the value 1.

The representation shown in FIG. 4 in this sense uses the analogy of a race, wherein the memory cells having the lowest resistance (and therefore the largest gradient of the integrated current over time) are the fastest to reach a destination 407.

The measurement begins accordingly at a time $t=t_0$ ("start") and the first three 0-states could already be determined for the memory cells 404, 402 and 405 at a time $t=t_1$ ("destination"). The other memory cells 401, 403 and 406 have not yet reached the destination, e.g., have not yet attained the voltage threshold value by means of the described integration.

The temporal sequence in which the memory cells have reached the destination (e.g., have attained the threshold value in the integration of the current) is known during the measurement; in this case, these are: first the memory cell 404, then the memory cell 402, and finally the memory cell 405.

In the present example of the 3-from-6 code, precisely 3 of the 6 memory cells have the 0-state and the remaining three memory cells have the 1-state. Since the 0-state can be established earlier than the 1-state, the measurement can be ended as soon as the third (and therefore last) 0-state could be determined. This applies on condition that the 0-states can actually be determined earlier than the 1-states.

The destination 407 thus divides the possible states of the memory cells 401 to 406 into two areas, an area 408 for the 1-states and into an area 409 for the 0-states. Significantly more time would therefore be needed until the memory cells having the 1-state attain the predefined voltage threshold value. These memory cells (in the example shown in FIG. 4, the memory cells 401, 403 and 406) have therefore not yet reached the destination 407 at time $t_1$ at which three 0-states could already be determined. The third 0-state could be determined at this time $t_1$. This is also the time at which the measurement can be ended and at which the states can be frozen on the sense amplifiers which are connected to the memory cells. In the present example, three 0-states are present for the memory cells 404, 402 and 405 following the freezing. The remaining three states for the memory cells 401, 403 and 406 are set in each case to 1.

In summary, the codeword can therefore be determined as soon as the first three "0" states are present. In the example shown in FIG. 4, the codeword 101001 (LSB corresponds to the memory cell 406) can be determined at time $t_1$.

The robustness or immunity from error of the detection depends on a runtime delay $\Delta t_r$. This characterizes a time interval between the memory cell 405 at time $t_1$ on reaching the destination 407 and the temporally next memory cell 403 for which no 0-state could yet be determined. In other words, the runtime delay $\Delta t_r$ thus designates the time difference between the "slowest 0" memory cell (here: the memory cell 405 for which the 0-state could be determined as the last of the three memory cells 404, 402 and 405) and the "fastest 1" memory cell (here: the memory cell 403 which, from the remaining memory cells 401, 403 and 406, is nearest to the memory cell 405 in relation to the 0-state at time $t_1$).

This runtime delay $\Delta t_r$ can, for example, be known. However, the runtime delay $\Delta t_r$ can change due to the effects of certain conditions (e.g. effect of temperature, ageing, etc.). If the runtime delay $\Delta t_r$ were too short, so that it cannot be determined with certainty whether the memory cell 403 or the memory cell 405 first attains the 0-state, the robustness of the memory would be jeopardized. It is therefore advantageous to determine the runtime delay $\Delta t_r$ and compare it if necessary with a predefined reference value in order to ensure that the memory is sufficiently robust, e.g., the integrity of the memory lies within the predefined tolerance.

It is proposed, by way of example, to modify the detection time, in particular to reduce the time for detecting the states of the "fast memory cells" and/or increase the time for detecting the states of the "slow memory cells". In other words, the fast cells become slower and the slow cells become faster by means of a modification of this type. This offers the advantage of being able to determine the runtime delay $\Delta t_r$ and to verify whether the slowest fast cell can still be reliably distinguished from the fastest slow cell.

Figure 5A:
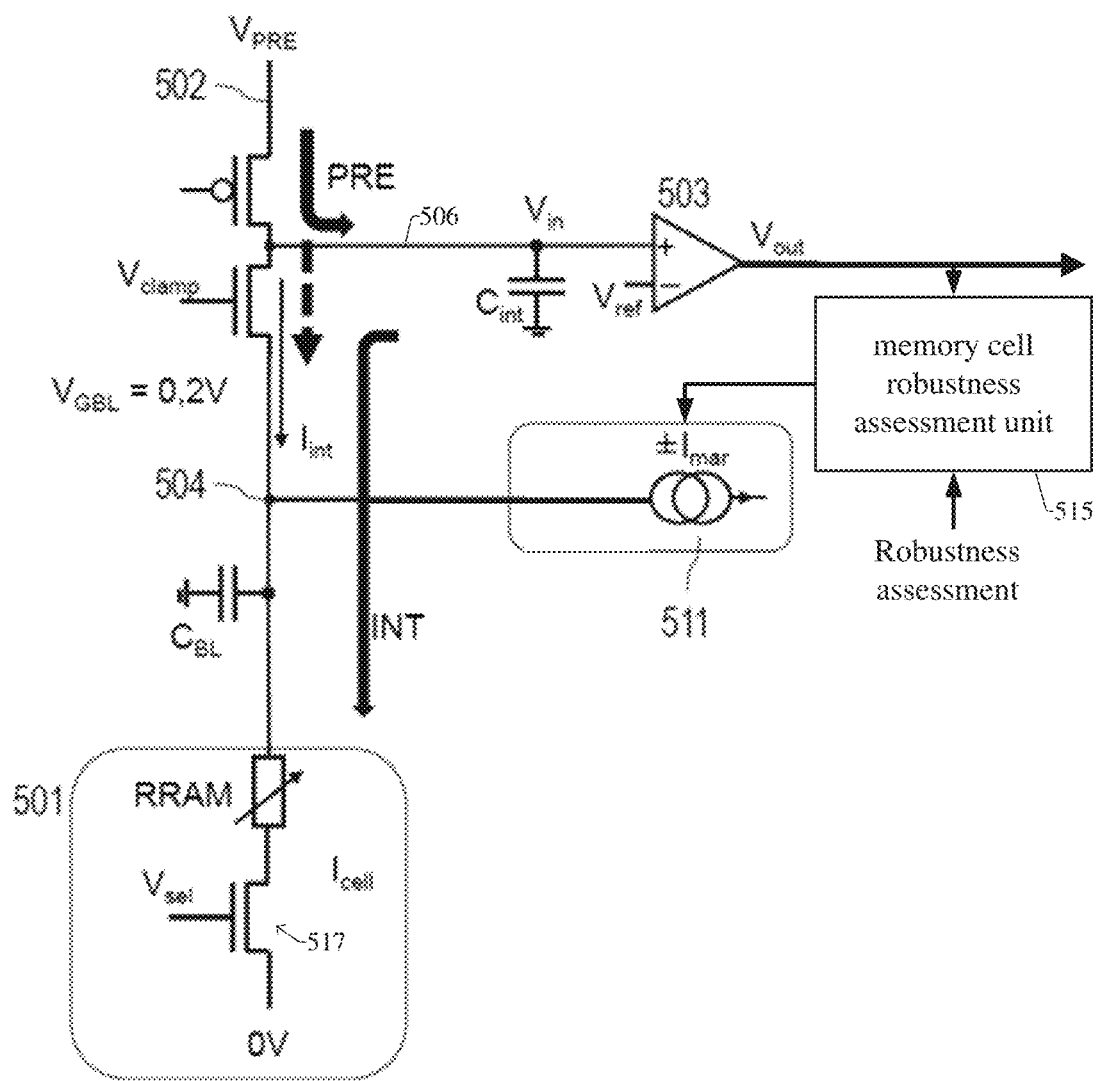
FIG. 5A shows a schematic diagram of a read data path for a memory cell, wherein a predefined current (also referred to as a margin current $I_{mar}$ and which can have a various current levels) is superimposed in order to modify a runtime delay $\Delta t_r$.

FIG. 5A shows a schematic diagram of a read data path for a memory cell 501, wherein a memory cell robustness assessment unit 515 induces a predefined current (also referred to as a margin current $I_{mar}$) that can be superimposed in order to modify the runtime delay $\Delta t_r$.

The memory cell 501 is shown in FIG. 5A by way of example as an RRAM memory cell. The memory cell 501 is selected via a MOSFET 517 by means of a voltage $V_{sel}$ and a current $I_{cell}$ flows through the memory cell.

The reading can be divided into two phases, a precharge phase and a sense phase.

A bit line 506 is precharged by means of a voltage $V_{PRE}$ (precharge voltage on precharge node 502 using pre-charge transistor 511) to a part of the precharge voltage (e.g. 0.2V). A voltage $V_{in}$ corresponding to the voltage $V_{PRE}$ is present on a first input terminal of a sense amplifier 503. The first input terminal of the sense amplifier (comparator) 503 is connected via a capacitor $C_{int}$ to ground. A reference voltage $V_{ref}$ is present on a second input terminal of the sense amplifier 503. The sense amplifier 503 supplies an output voltage $V_{out}$ at its output terminal. This output voltage is indicative of the data state that was read from the memory cell 501. For example, in some cases, the memory cell 501 can be configured to switch between a first data state (e.g., a logical "0") and a second data state (e.g., a logical "1", or vice versa), though multi-bit data states could also be stored.

The margin current $I_{mar}$ can be fed in with a positive or negative sign at the node 504 between the sense amplifier and the memory cell 501. It is thus possible for a current lint for the integration to be modified by the margin current $\pm I_{mar}$. In some regards, the margin current can have various current levels at various times (e.g., first current level, second current level, and/or third current level).

Figure 5B:
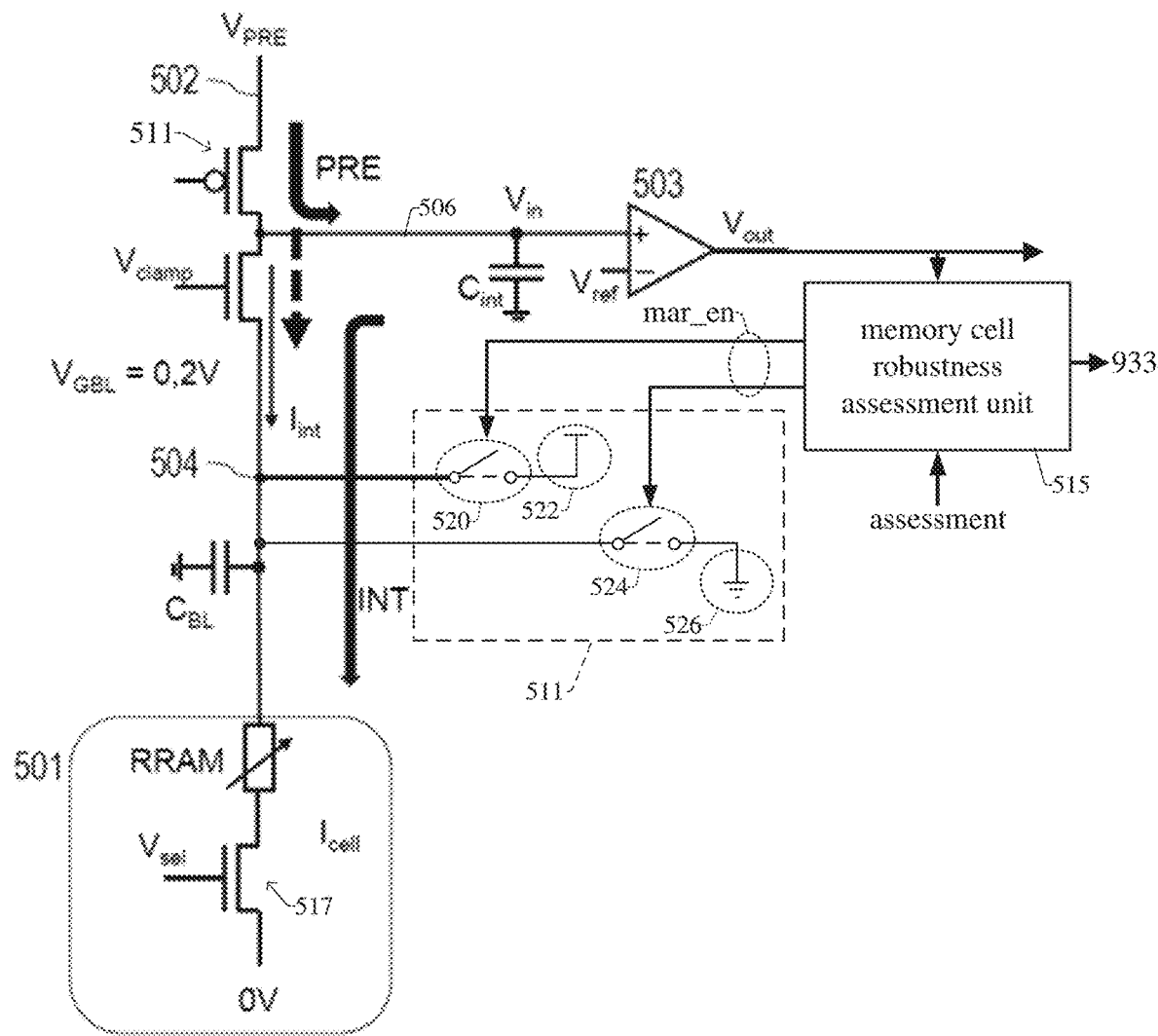
FIG. 5B shows another schematic diagram of a read data path for a memory cell.

FIG. 5B shows another example schematic diagram of a read data path for a memory device. The read data path includes a memory cell 501, and a sense amplifier 503 including a first input terminal, a second input terminal, and an output terminal. A bitline 506 couples the memory cell 501 to the first input terminal of the sense amplifier 503. A reference bitline is coupled to the second terminal of the sense amplifier 503. A variable current source 511 is coupled to the bitline 506 via the node 504. A memory cell robustness assessment unit 515 has an input that is coupled to the output terminal of the sense amplifier, and has an output coupled to a control terminal of the variable current source 511.

In FIG. 5B's example, the variable current source 511 includes a first switching device 520 that selectively couples a first power supply 522 to the node 504, and also includes a second switching device 524 that selectively couples a second power supply 526 to the node 504. The first switching device 520 has a first input/output terminal, a second input/output terminal, and a first control terminal. The first input/output terminal is coupled to the node 504, the second input/output terminal is coupled to the first power supply 522, and the first control terminal coupled to an output of the memory cell robustness assessment circuit 515. The second switching device 524 has a third input/output terminal, a fourth input/output terminal, and a second control terminal. The third input/output terminal is coupled to the node 504, the fourth input/output terminal is coupled to the second power supply 526, and second control terminal is coupled to an output of the memory cell robustness assessment circuit 533.

In some examples, the first power supply 522 is configured to provide a first current level, and the second power supply 526 is configured to provide a second current level that is less than the first current level. For instance, in the illustrated example of FIG. 5B, the first power supply can act as a current source that provides a positive current to the node and the second power supply can act as a current sink that provides a negative current to the node. In some examples, the first and second switching devices could be MOSFETs, but could other be other types of transistors, such as BJTs, junction FETs, etc.

During operation, the memory cell robustness assessment unit 515 is configured to perform a first read operation on the memory cell 501 to read a first data value from the memory cell. During the first read operation, the variable current source provides a first assessment current having a first current level to the node 504 and bitline 506. For instance, in some cases, during the first read operation, the first switching device 520 and the second switching device 524 are both open, such that the first current level is substantially zero. Subsequently, the memory cell robustness assessment unit 515 performs a second read operation on the memory cell 501 to read a second data value from the first memory cell. During the second read operation, the variable current source 511 manipulates the first current level to provide a second current level to the node 504 and bitline 506. There is a difference between the first current level and the second current level, and this difference is based on whether the first data value read during the first read operation was the first data state or the second data state. For instance, in some cases, the second current level is a positive current ($+I_{mar}$) when the memory cell was read to be in the first data state during the first read operation, and the third current level is a negative current ($-I_{mar}$) when the memory cell was read to be in the second data state during the first read operation. Thus, the second read operation is a "check" of the first read operation, but with a manipulated current level/margin to "test" the robustness of the cell by slowing read operations for faster data reads and speeding up read operations for slower data reads.

Figure 6:
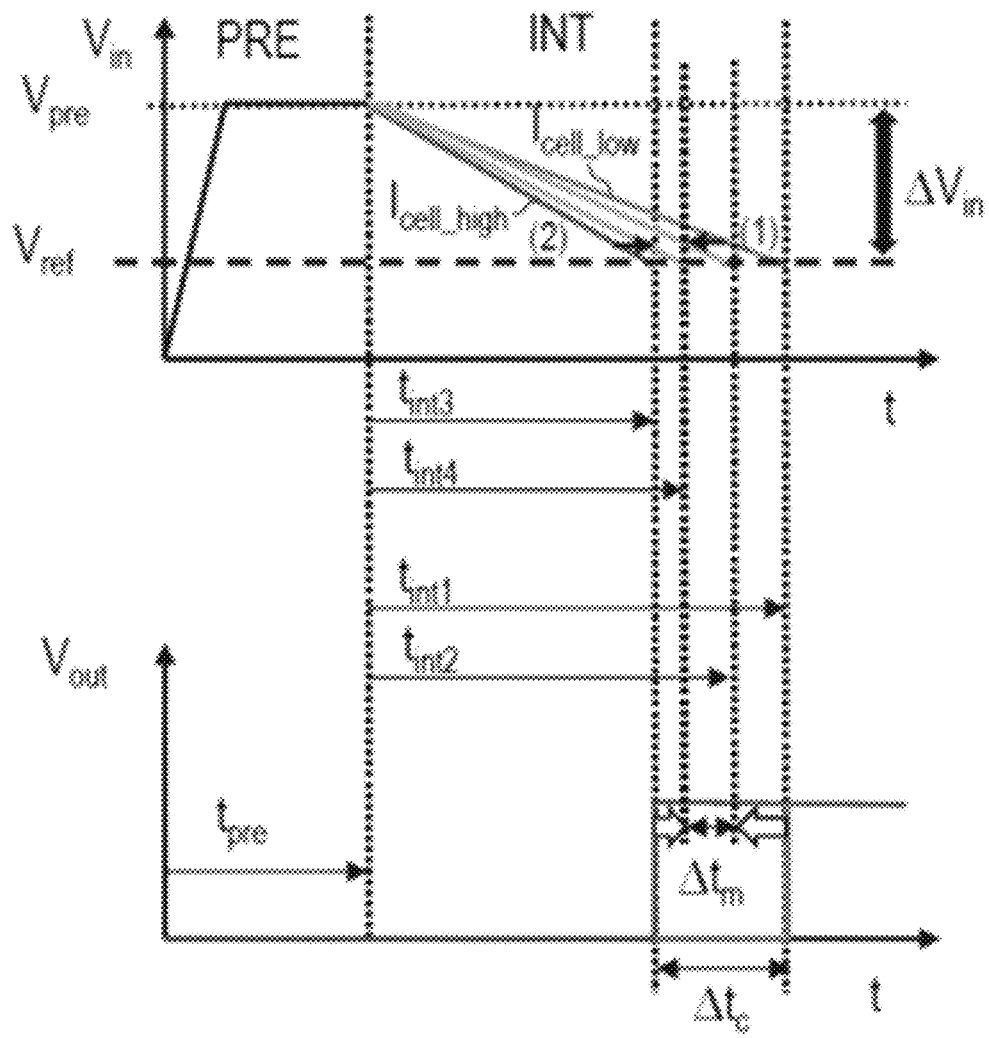
FIG. 6 shows a diagram indicating the effect of the margin current on the voltage Vin and the output voltage Vout.

FIG. 6 shows a diagram of the voltage Vin and the output voltage Vout over time t.

Two phases are described below, a precharge phase PRE and an integration phase INT.

The precharge phase PRE lasts a time $t_{pre}$. The precharging of the bit line 506 and of the capacitor $C_{int}$ takes place during this time $t_{pre}$. The time $t_{pre}$ is, for example, approximately 5 ns. The voltage $V_{in}$ increases to a voltage $V_{PRE}$ during the precharge phase PRE.

The integration phase INT follows the precharge phase PRE. The integration phase lasts a time tint which is determined as follows:

$$t_{int} = \frac{\Delta V_{in} C_{int}}{I_{cell} \pm I_{mar}},$$

where $\Delta V_{in} = V_{PRE} - V_{ref}$.

Two Cases are Distinguished:
(1) The Margin Current+$I_{mar}$ is Fed to the Node 504:
if the memory cell 501 is in its high resistive state, a low current $I_{cell\_low}$ flows for a time $t_{int1}$. If the current $I_{cell\_low}$ is increased by the current $+I_{mar}$, the integration phase is thereby shortened to a time $t_{int2}$.
(2) The margin current $-I_{mar}$ is fed to the node 504:
if the memory cell 501 is in its low resistive state, a higher current $I_{cell\_high}$ flows for a time $t_{int3}$. If the current $I_{cell\_high}$ is reduced by the current $-I_{mar}$, the integration phase is thereby lengthened to a time $t_{int2}$.

In other words, the slow cell becomes faster in case (1) and the fast cell becomes slower in case (2).

The respective margin current can be applied depending on the state of the cell: if the cell is in the low resistive state, the current, $-I_{mar}$ is applied, and if the cell is in the high resistive state, the current $+I_{mar}$ is applied.

Without the application of the margin currents $\pm I_{mar}$, the cell has a runtime delay as follows:

$$\Delta t_c = t_{int1} - t_{int3}$$

and with the application of the aforementioned margin currents $\pm I_{mar}$, the runtime delay for this cell is as follows:

$$\Delta t_m = t_{int2} - t_{int4}$$

With $\Delta t_c > \Delta t_m$, the runtime delay is reduced for the cell concerned.

This approach can be adopted for at least one cell type (LRS or HRS) of the memory. In particular, it is possible to check whether read errors occur for the memory due to a runtime delay of at least one of its memory cells. It is possible to test, for example, whether different read results are obtained due to the reduction in the runtime delay, e.g., whether the read value varies depending on whether the margin currents have been applied for at least one of the cells.

Figure 7:
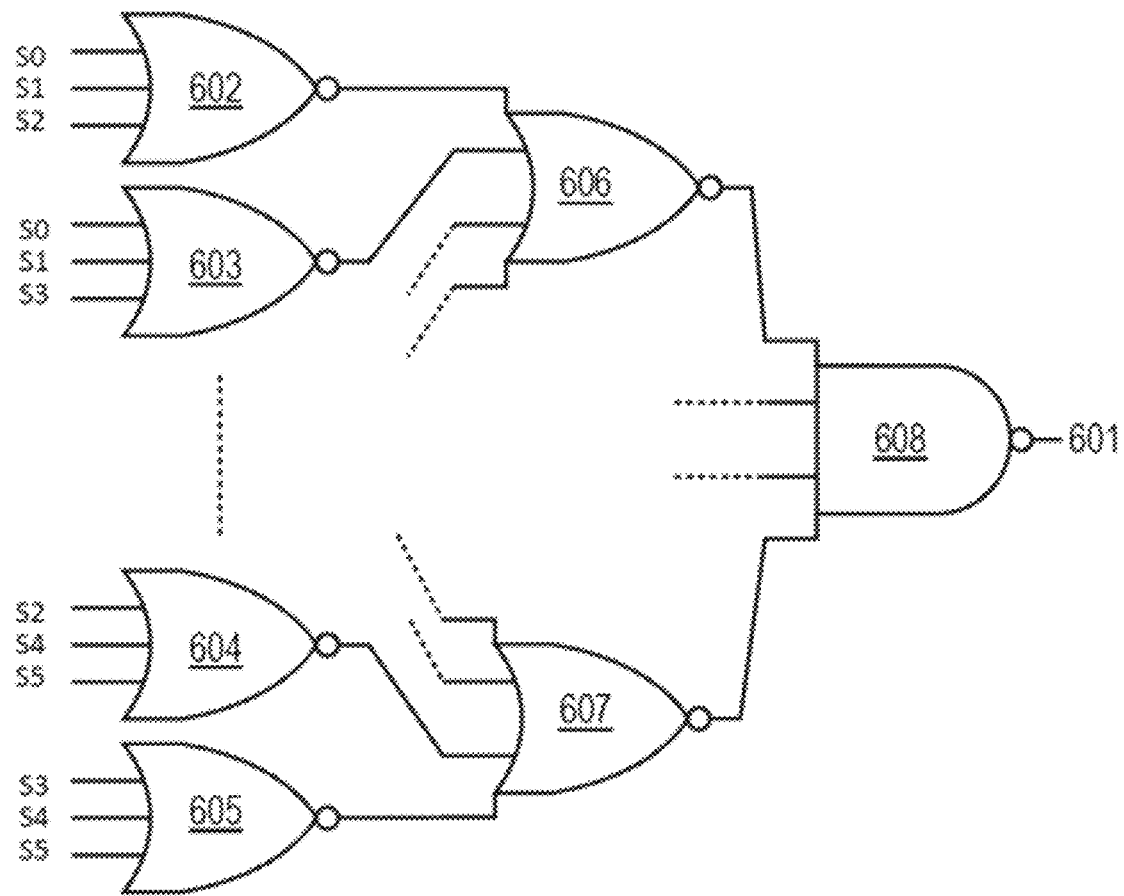
FIG. 7 shows an example of a logic circuit for determining the three fastest 0-states.

FIG. 7 shows an example of a logic circuit for determining the three fastest 0-states by means of an output signal 601, on the basis of the six states S0 to S5. Each state is provided here as a signal for a memory cell by a sense amplifier. The states S0 to S5 correspond accordingly to signals (0 or 1) of the 6 memory cells.

The states S0 to S5 are provided in the form of binary values.

In the case of the 3-from-6 code, it can be concluded following the arrival of the third 0-state that the remaining states must be 1. According to this example, the circuit from FIG. 7 shows a logic for detecting the three fastest bits which—as explained above—are 0-states (e.g., have the value 0). If the output signal 601 therefore has the value 1, this indicates that the value 0 has been detected three times at the outputs of the sense amplifiers.

The circuit according to FIG. 7 uses NOR gates by way of example for this purpose. A multiplicity of NOR gates, each having three inputs and one output, are provided at the input. Three of the 6 states S0 to S5 always have the value 0 for each codeword, e.g., the possible codewords provide 20 combinations in which precisely 3 of the states S0 to S5 are equal to 0. These combinations correspond to the assignments of the inputs of the total of 20 NOR gates 602 to 605 (for the sake of clarity, not all 20 NOR gates are shown, but only a selection of four NOR gates).

FIG. 8 shows an example of a corresponding truth table. Rows 1 to 20 represent possible codewords of the 3-from-6 code: There are 20 possibilities for the states S0 to S5 to assume the value "0" three times and the value "1" three times. Rows 1 to 16 (e.g., 16 possible codewords of the 3-from-6 codes) can be used, for example, to represent 16 possible states which are codable with four bits ($2^4=8$). The then remaining 4 codewords of rows 17 to 20 are then unused, e.g., are codewords of the 3-from-6 code, but are not valid or are not used for coding the 16 states. Alternatively, it is also possible to use 16 codewords from the 20 possible codewords other than the first 16 codewords shown in the table. These "unused" codewords can be used elsewhere. Specific data, for example, can be invalidated (e.g., marked as invalid) with them.

One of the aforementioned NOR gates 602 to 605 can be used for each assignment with 0-states of the 20 rows shown in FIG. 8. A NOR gate is therefore connected in each case to the 0-states of a row.

Thus, for example, the inputs of the NOR gate 602 are connected to the states S0, S1 and S2. This corresponds to row 1 of the table shown in FIG. 8, according to which the states S0, S1 and S2 have the value 0. The inputs of the NOR gate 603 are connected accordingly to the states S0, S1 and S3. This corresponds to row 2 of the table shown in FIG. 8, according to which the states S0, S1 and S3 have the value 0.

The further NOR gates are connected accordingly to the signals of the states S0 to S5.

Finally, the inputs of the NOR gate 604 are connected to the states S2, S4 and S5. This corresponds to row 19 of the table shown in FIG. 8, according to which the states S2, S4 and S5 have the value 0. The inputs of the NOR gate 605 are connected to the states S3, S4 and S5. This corresponds to row 20 of the table shown in FIG. 8, according to which the states S3, S4 and S5 have the value 0.

Each of these NOR gates 602 to 605 therefore supplies the value 1 at its output only if all of its inputs have the value 0.

The following example of an implementation comprising five NOR gates 606 to 607 (each having four inputs) and one NAND gate 608 (having five inputs) corresponds to an OR link of the outputs of all NOR gates 602 to 605 to the output signal 601.

In FIG. 7, for example, each output of one of the NOR gates 602 to 605 is thus connected to an input of one of the downstream NOR gates 606 to 607. The outputs of the NOR gates 606 to 607 are connected to the inputs of the NAND gate 608.

The output signal 601 has the value 1 only if three fastest bits have been detected. If no three fastest bits have been detected, the output signals of the NOR gates 602 to 605 are all 0, the outputs of the NOR gates 606 to 607 are all 1, and the output signal 601 has the value 0. However, as soon as the value 0 is applied to three of the six possible states S0 to S5, the NOR gate 602 to 605 which maps this combination at its inputs switches at its output from 0 to 1 so that the outputs of the NOR gates 606 to 607 also switch from 1 to 0 and the output signal 601 flips from 0 to 1.

Generally speaking, the detection of the m fastest 0-states can be detected with a circuit which, at a first level, has a number of NOR gates corresponding to the m-from-n possible combinations. Each of the NOR gates has m inputs and each of the NOR gates maps at its outputs one of the m-from-n possible combinations in which m 0-states can occur. The outputs of the NOR gates are then logically OR-linked to an output signal. This logical OR link can be implemented, for example, by means of a two-stage use of NOR gates and a NAND gate, as shown in FIG. 7. The output signal indicates with a value 1 that at least m 0-states are present. The output signal otherwise has the value 0.

A plurality of logic circuits of this type can be used to determine different numbers $m_1$, $m_2$, etc., of 0-states. The 0-states are registered whenever the output signal of the respective logic circuit has the value 1. It is thus possible to determine which 0-states occur successively.

Figure 9:
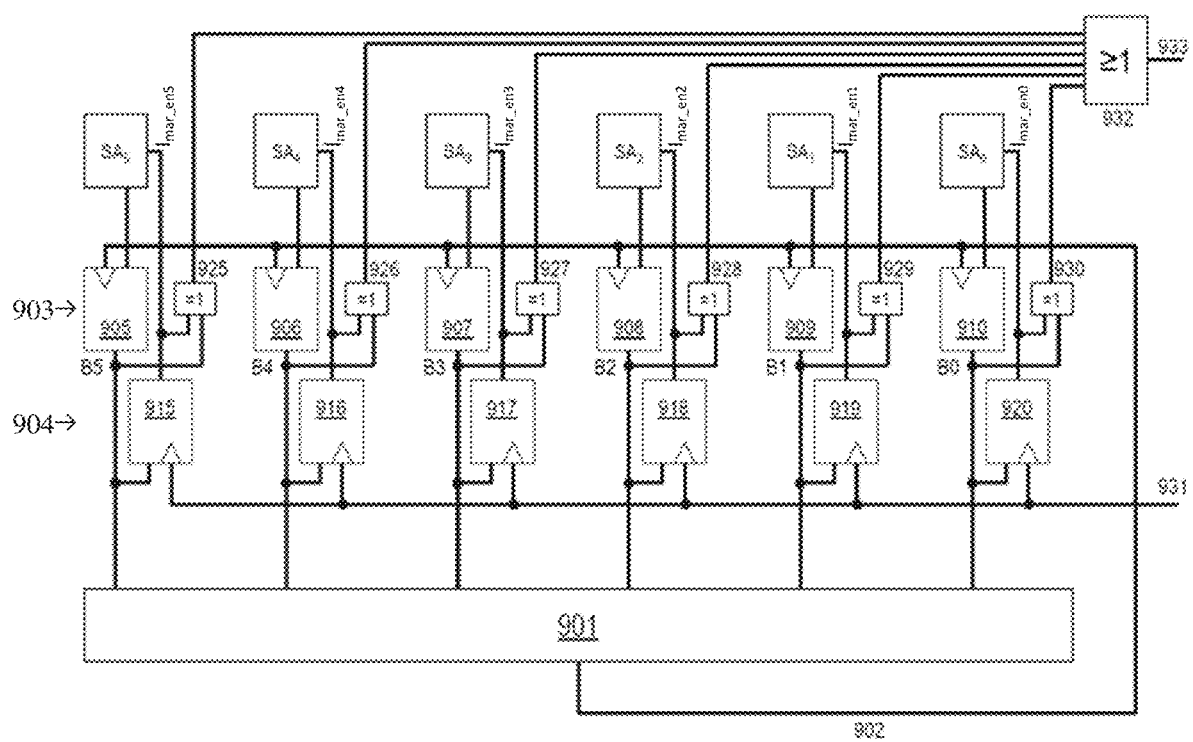
FIG. 9 shows an example of a circuit arrangement for determining the robustness of memory cells.

FIG. 9 shows an example of a circuit arrangement, wherein the logic circuit shown in FIG. 7 can be accommodated in a block 901. The circuit arrangement includes a first latch stage 903 and a second latch stage 904 arranged in series. Each latch of the first latch stage 903 has a first latch input and a first latch output, wherein the first latch input is coupled to an output terminal of a respective sense amplifier. Each latch of the second latch stage 903 has a second latch input and a second latch output, wherein the second latch input is coupled to a corresponding first latch output. Each logic circuit, for example, which enables a detection of the m fastest 0-states can be accommodated in the block 901. FIG. 9 describes how these states can be frozen and therefore registered by means of a logic circuit of this type at the time of the occurrence of the m fastest 0-states. FIG. 9 further describes how these states can be compared with subsequent states which are produced by means of the margin current.

Sense amplifiers $SA_0$ to $SA_5$ supply the states S0 to S5 of the underlying memory cells (not shown in FIG. 9). These states are fed via latches 905 to 910 (e.g. level-controlled D-flip-flops) to the block 901. The three fastest 0-states are detected in the block 901 and the states of the latches 905 to 910 are frozen ("latched") via a connection 902.

Thus, as soon as the output signal 601 of the logic circuit shown in FIG. 7 switches from 0 to 1, this is communicated via the connection 902 to the first stage of latches 905 to 910: it is thus indicated that the fastest three 0-states have been detected and the first stage of latches 905 to 910 are held so that the outputs provided by them no longer change. The three fastest 0-states are present at this "frozen" time at the outputs of the first stage of latches 905 to 910.

The output of the latch 905 is connected to the input of a latch 915 of the second stage of latches. The output of the latch 915 supplies an enable signal $I_{mar\_en}$ to the sense amplifier $SA_5$. The margin current $I_{mar}$ can be enabled with the enable signal $I_{mar\_en}$. This can be achieved, for example, by means of the variable current source 511 shown in FIG. 5A and/or 5B, and/or by way of the switching devices 520, 524 which selectively provide the margin current $\pm I_{mar}$ to or from the node 504.

An input 931 can freeze the latch 915. The output of the latch 905 is connected to the first input of a first logic gate 925 in the form of an exclusive-OR gate, and the output of the latch 915 is connected to the second input of the first logic gate 925 (exclusive-OR gate)HSR. The output of the exclusive-OR gate 925 is connected to an input of an OR gate 932. A signal 933 is present at the output of the OR gate 932.

The remaining five cells have a corresponding structure: each of the remaining sense amplifiers $SA_4$, $SA_3$, $SA_2$, $SA_1$ and $SA_0$ has a first latch 906 to 910, a second latch 916 to 920, and an exclusive-OR gate 926 to 930.

The output of the respective exclusive-OR gate 926 to 930 is connected to a further input of the OR gate 932. All latches 915 to 920 can be frozen via the input 931.

A normal read operation is first carried out (without enabled margin current $I_{mar}$). As already described, the three fastest cells are determined and the output signal 602 freezes the latches 905 to 910 via the connection 902.

The signal present at the output of the respective first latch 905 to 910 is then transferred into the respective second latch 915 to 920. The second latches 915 to 920 are frozen by means of a storage signal present at the input 931. In this case, the second latches 915 to 920 store the state previously output by the first latches 905 to 910. The signal present at the output of the second latches 915 to 920 serves to enable the margin current $I_{mar}$ (if $I_{mar\_en}=1$) or not to enable the margin current $I_{mar}$ (if $I_{mar\_en}=0$). It is also possible for the margin current to be determined as follows depending on the signal present at the output of the second latches: signal 0: margin current $-I_{mar}$; signal 1: margin current $+I_{mar}$.

The latches 905 to 910 are no longer latched (reset of the output signal 602), and a state is set accordingly at the output of the latches 905 to 910 depending on the margin current $I_{mar}$. The three fastest cells are again determined and the output signal 602 freezes the latches 905 to 910 via the connection 902.

The last value is then present at the outputs of the first latches 905 to 910, taking account of the respective margin current $I_{mar}$. The preceding value is present accordingly at the outputs of the second latches 915 to 920, without taking account of the respective margin current $I_{mar}$. It is possible, by means of the exclusive-OR gates 925 to 930, to determine for each cell whether the application of the margin current has resulted in the output of a different value.

Since the exclusive-OR gate outputs the value 0 only if the signals are identical at both inputs, the value 1 at the output of any of the exclusive-OR gates 925 to 930 indicates that a cell does not have the required robustness in relation to the applied margin current.

The signal 933 at the output of the OR gate 932 having the value 1 correspondingly indicates that at least one of the memory cells does not have the required robustness for the margin current that is used, and the value output by at least one cell has changed only as a result of the applied margin current.

Figure 10:
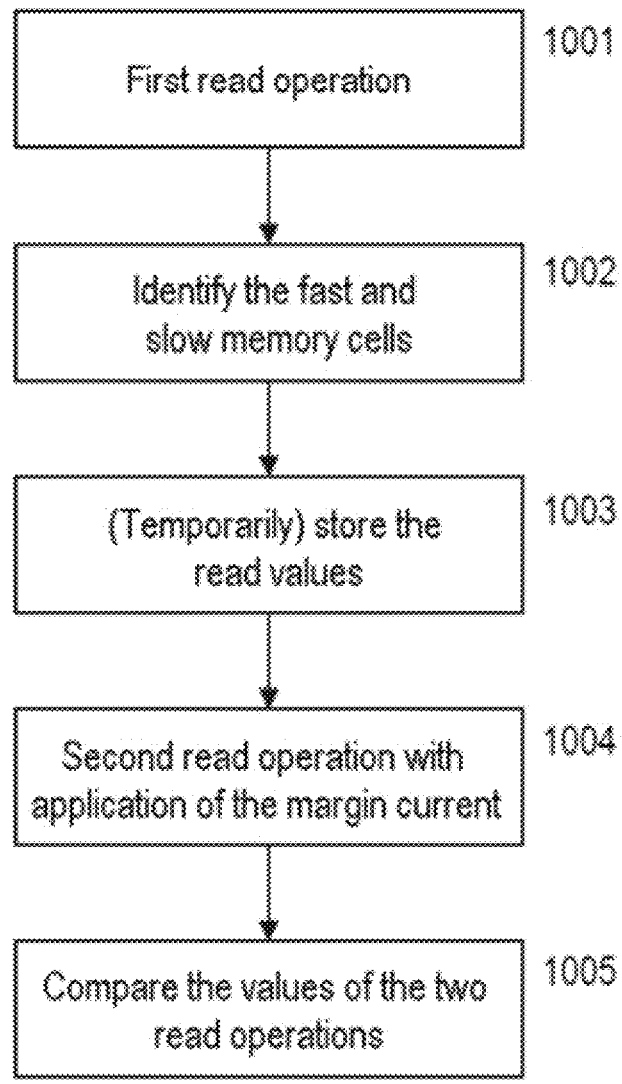
FIG. 10 shows an example of a flow diagram with steps illustrating the comparison of first values read from memory cells with second values which have been determined under the condition of the applied margin current.

FIG. 10 shows an example of a flow diagram with examples of steps of the method described here: In a step 1001, a first read operation is carried out in the memory. In a step 1002, the fast and slow cells are identified. In a step 1003, the read values are (temporarily) stored and, in a step 1004, a second read operation is carried out using the margin current. In a step 1005, the (temporarily) stored values are compared with the values of the second read operation and robustness, for example, is thus determined.

Use of Relative Limits

Relative or variable limit values can optionally be used.

Figure 11:
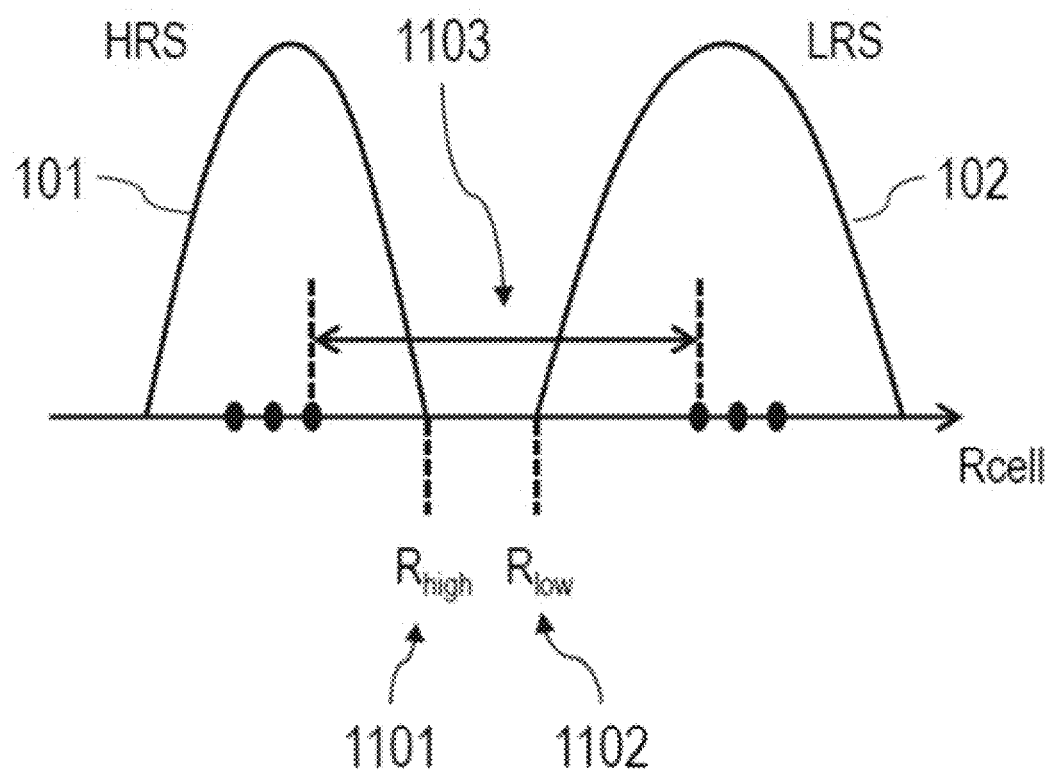
FIG. 11 shows an example of a diagram based on FIG. 3A with two frequency distributions for cell resistances of memory cells to illustrate relative and absolute threshold values.

FIG. 11 shows an example of a diagram based on the above FIG. 3A with two frequency distributions for cell resistances of memory cells. Resistance values Rcell of a total of 6 memory cells are plotted in this example, wherein 3 memory cells have a low resistive state (LRS) and 3 memory cells have a high resistive state (HRS).

Compared with the distribution 102, the distribution 101 has an upper absolute threshold value $R_{high}$ 1101 and, compared with the distribution 101, the distribution 102 has a lower absolute threshold value $R_{low}$ 1102.

A relative threshold value 1103 (also referred to as a minimum interval) further exists which is determined by the intervals between the actual cell resistance values. Instead of the absolute threshold values, relative threshold values can be tested by means of the margin current.

An unnecessary setting or reset of the memory cells can be avoided using the relative threshold value. By means of a relative current interval criterion as a relative threshold value, it can be ensured in a bit group that the HRS cells and the LRS cells are sufficiently spaced apart from one another and that local effects are thus taken into account.

Use of Additional Time Delay

The example shown in FIG. 9 can be supplemented with at least one additional time delay. A delay $\Delta t_v$, for example, can be applied for this purpose to the signal supplied via the output of the block 901 (connection 902). This can be achieved by feeding the connection 902 to a multiplexer which forwards either the output signal of the block 901 or the output signal of the block 901 delayed by $\Delta t_v$ to the latches 905 to 910. A plurality of (different) delays can be switched accordingly via the multiplexer.

A measure of the robustness of the memory can be determined on the basis of the at least one delay $\Delta t_v$: The time window is expanded by the delay $\Delta t_v$ so that the states of a plurality of cells fall within this time window. An expanded time window is therefore also a measure of robustness. The size of the time window up to which the memory still supplies robust (error-free) results or the extent to which the memory can further deteriorate before producing errors can be determined by setting or testing a plurality of delays $\Delta t$. This is particularly advantageous for determining the ageing of the memory and/or the effect of temperature changes on the memory.

This is helpful, in particular, for detecting critical ("borderline") states which may not (yet) be detectable under normal conditions but can result in an erroneous detection due to a further unfavorable shifting of cell states in the group.

As a countermeasure, the memory (e.g. the RRAM) can be reprogrammed or a correspondingly redundant design can already be provided for the defective memory cell(s) during the testing of the memory. This is significant, in particular, for safety applications, e.g. for detecting and remedying critical situations.

Example of a System Implementation: RRAM

Figure 12:
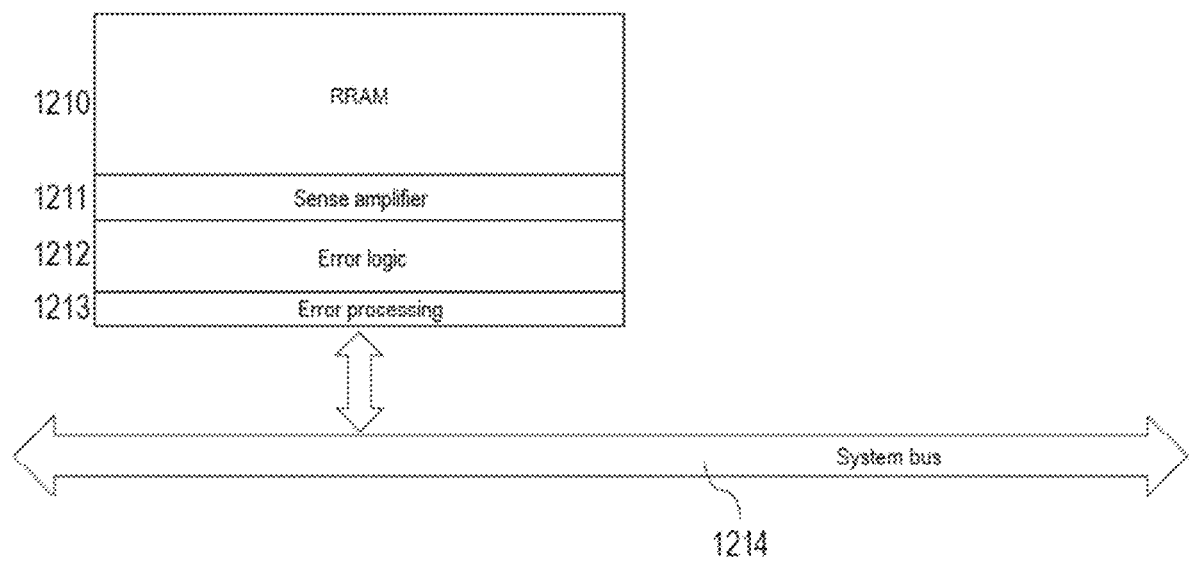
FIG. 12 shows an example of a system implementation for an MRAM.

FIG. 12 shows an example of a system implementation for an RRAM 1210 comprising a multiplicity of memory cells. The values stored in the memory cells are read via sense amplifiers 1211 and the memory cells are assigned to logical (0 or 1) states using the error logic 1212 described here. This error logic 1212 comprises, for example, the determination explained above of the k fastest states of a k-from-n code. As soon as the k fastest states are present, the outputs of the memory cells (the outputs of the sense amplifiers assigned to the memory cells which indicate the state of the memory cells) are frozen. This is done, for example, by means of the circuit described in FIG. 9.

If the states do not represent a valid codeword, an error processing 1213, in particular, an error detection and/or error correction, can be carried out.

The error processing 1213 can use, for example, an error code, in particular an error-detecting code, which has check bits which are formed from the bits of different groups of n bits. The check bits can be formed, for example, by means of a Berger code or by means of a BCH code.

The error processing 1213 is connected to a system bus 1214.

The sense amplifier can access the memory in each case in groups of n bits. A bit sequence which is read in each case from n memory cells can thus be further processed as a group of n bits. If no errors are present, each of the bit sequences represents a codeword of a k-from-n code. For example, n can be equal to 6 or equal to 8.

Figure 13:
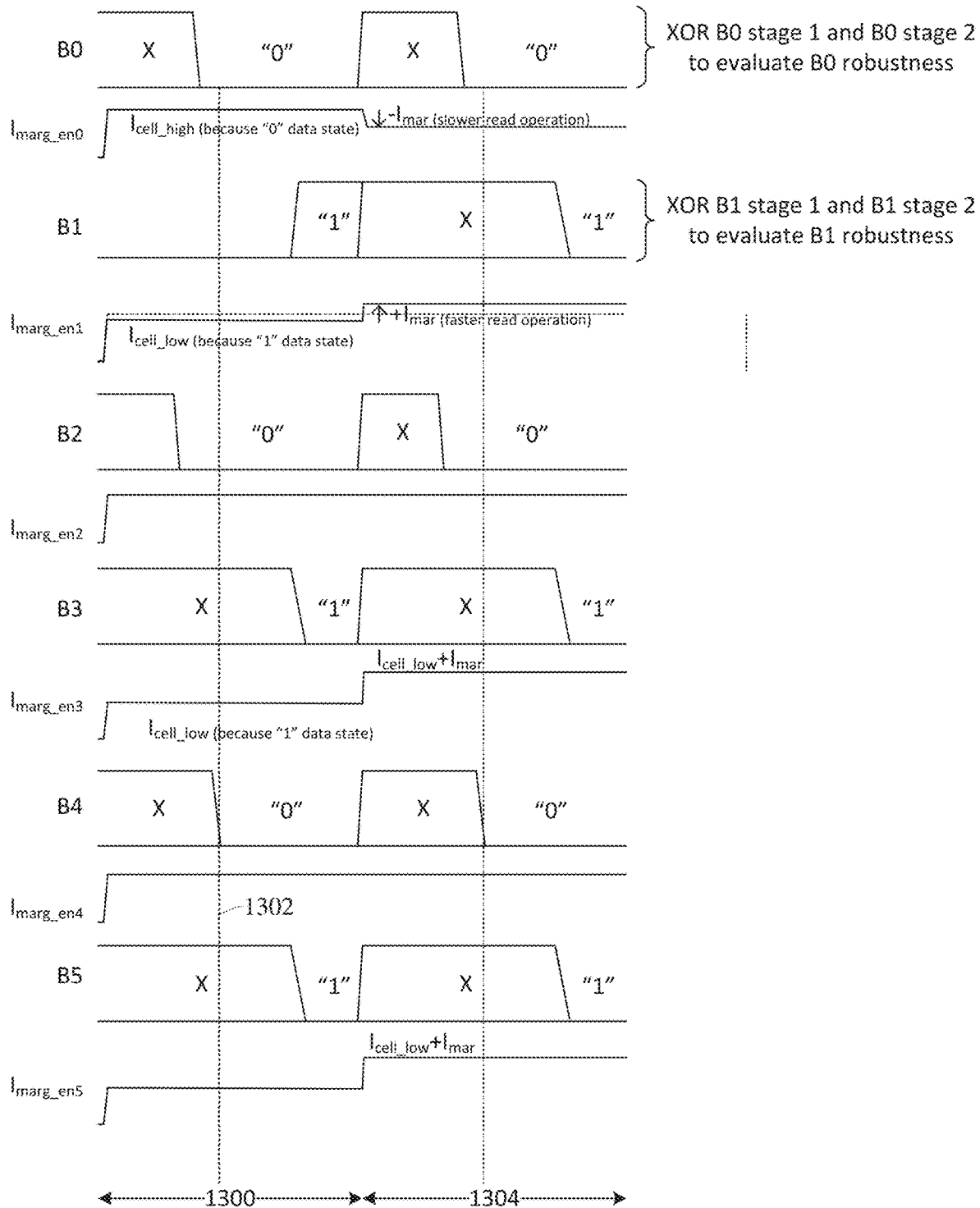
FIG. 13 shows an example of a waveform for a read margin assessment operation.

FIG. 13 provides a rough timing diagram illustrating some aspects of methods and functionality carried out by memory devices in accordance with some aspects of this disclosure. It will be appreciated that this timing diagram is merely an example, and deviations from this timing diagram are contemplated as falling within the scope of this disclosure. More particularly, the waveforms of FIG. 13 illustrate data states (e.g., voltages) on six bitlines (e.g., B0, . . . , B5), and corresponding read currents on each of the six bitlines. It will be appreciated that each bitline is coupled to a corresponding memory cell (e.g., 501), a corresponding sense amplifier (e.g., 503), and a corresponding variable current source (e.g., 511)— see e.g., FIG. 5A-5B.

In FIG. 13's timing diagram, a two-stage read margin assessment is carried out on the memory cells with different current levels being applied to the memory cells in these stages to "stress" the robustness/data integrity of the memory cells. During a first stage of a read margin assessment (see time 1300), a first read operation is carried out. During this first stage of the read margin assessment 1300, a nominal read current is provided through each memory cell. For cells that are in a low resistance state (e.g., logical "0"— see e.g., B0, B2, and B4), a somewhat higher current is read from these cells due do their lower resistance; whereas for cells that are in a high resistance state (e.g., logical "1"— see e.g., B2, B3, and B5), a somewhat lower current is read from these cells due to their higher resistance (see dashed line comparison for $I_{marg\_enB1}$). The higher current results in the logical "0" cells having their data "read" earlier—see time 1302 when data states that were previously unknown X are now determined to be "0". Thus, at time 1302 a strobe signal can be provided on a communication path (e.g., 902) to store these "fast" data states, which in turn also sets current levels to be used for the second stage of the read margin assessment.

In 1304, a second stage of the read margin assessment is carried out. During this second stage 1304, the variable current source 511 for each memory cell 501 is coupled to the corresponding bitline and provides a current level that is based on the data state read from each memory cell during the first stage of the read margin assessment 1300. Thus, for "fast" memory cells that were read in a "0" state during 1300 (e.g., bitlines B0, B2, B4), the variable current source provides a negative current level $-I_{mar}$ during 1304 (so current is sunk or pulled out of the corresponding bitlines), which generally "slows" read operations for these cells during the second stage of the read margin assessment 1304. In contrast, for "slow" memory cells that were in a "1" state during 1300 (e.g., bitlines B1, B3, B5), the variable current source provides a positive current level $+I_{mar}$ during 1303 (so current is injected into the corresponding bitlines), which generally "speeds" read operations for these cells during the second stage of the read margin assessment 1304.

Then, once the data states are determined for the second stage of the read margin assessment, the first data state read in the first stage 1300 for each cell is compared to the second data state read in the second stage 1304 for each cell. This can be done using XOR logic block (e.g., 925-930 in FIG. 9), and the logical comparisons of the XOR logic blocks can be combined by OR gate 932 to determine whether any of the cells may have read robustness issues. Thus, if the first data state read from a memory cell in the first read stage 1300 differs from a second data state read from the same memory cell during the second read stage 1304, a read margin issue may be present for that cell and remedial action can be taken. For example, the current level used to read, write and/or reset that memory cell can be changed to prevent data errors, the memory cell can be deactivated, and/or an address corresponding to the first memory cell can be mapped to another memory cell. In this way, some disclosed technique allow for aging and/or degrading memory cells to be identified so remedial actions can be taken that facilitate highly reliable data robustness over a longer lifetime for the device than previously achievable.

Further Designs and Advantages

Examples described herein enable assessment of the robustness of a memory, in particular by manipulating the read window in order to determine, for example, the extent to which a manipulation of this type still produces error-free read results.

The approach is suitable, for example, for memories in which a logical bit (e.g., a value 0 or 1) is stored in at least two physical memory cells.

The robustness of the memory can thus be determined and a read window can also be relatively adapted through the application of the margin current described herein. This is advantageous for write or delete operations (set/reset).

The reliability of the memory that is used is advantageously increased by means of the solution described here, in particular when data are read from the memory, and possible effects of temperature or degradation are at least partially compensated.

Although the disclosure has been illustrated and described in greater detail by means of the at least one example embodiment shown, the disclosure is not limited thereto and other variations may be derived therefrom by the person skilled in the art without departing the protective scope of the disclosure.

What is claimed is:

1. A method for accessing memory cells that are each configured to store a first data state and a second data state, the method comprising:
    performing a first read operation on a first memory cell to read a first data value from the first memory cell, wherein during the first read operation a first variable current source provides a first assessment current having a first current level to a first bitline coupled to the first memory cell; and
    performing a second read operation on the first memory cell to read a second data value from the first memory cell, wherein during the second read operation the first variable current source manipulates the first current level to provide a second current level to the first bitline, wherein a difference between the first current level and the second current level is based on whether the first data value that was read during the first read operation was the first data state or the second data state.

2. The method of claim 1, further comprising:
    performing a comparison of the first data value with the second data value.

3. The method of claim 2, further comprising:
    based on the comparison of the first data value with the second data value, changing a current level used to read, write and/or reset the first memory cell; or
    based on the comparison of the first data value with the second data value, deactivating the first memory cell or mapping an address corresponding to the first memory cell to another memory cell.

4. The method of claim 1, wherein the first current level is independent of the first data value.

5. The method of claim 1, wherein the first current level is substantially zero, and the second current level is a positive current when the first data value is the first data state and is a negative current when the first data value is the second data state.

6. The method of claim 5, wherein the first data state corresponds to a high resistance state for the first memory cell and is read more slowly during the first read operation, and the second data state corresponds to a low resistance state for first the memory cell and read more quickly during the first read operation.

7. The method of claim 1, wherein the first read operation also reads a third data value from a second memory cell, wherein during the first read operation a second variable current source provides a second assessment current having the first current level to a second bitline coupled to the second memory cell; and
    wherein the second read operation reads a fourth data value from the second memory cell, wherein during the second read operation the second variable current source manipulates the first current level to provide a third current level to the second bitline, wherein the third data value is different from the first data value and the third current level is different from the second current level.

8. The method of claim 1, wherein the first read operation also reads a third data value from a second memory cell, wherein during the first read operation a second variable current source provides a second assessment current having the first current level to a second bitline coupled to the second memory cell; and wherein the second read operation reads a fourth data value from the second memory cell, wherein during the second read operation the second variable current source manipulates the first current level to provide a third current level to the second bitline, wherein the third data value is the same as the first data value and the third current level is equal to the second current level.

9. A memory device, comprising
a memory cell;
a sense amplifier comprising a first input terminal, a second input terminal, and an output terminal;
a bitline coupling the memory cell to the first input terminal of the sense amplifier;
a reference bitline coupled to the second input terminal of the sense amplifier;
a variable current source coupled to the bitline; and
a memory cell robustness assessment unit coupled to a control terminal of the variable current source;
wherein the variable current source comprises:
a first switching device having a first terminal, a second terminal, and a first control terminal; the first terminal coupled to the bitline, the second terminal coupled to a first power supply that is configured to source current onto the bitline, and the first control terminal coupled to the memory cell robustness assessment unit; and
a second switching device having a third terminal, a fourth terminal, and a second control terminal; the third terminal coupled to the bitline, the fourth terminal coupled to a second power supply that is configured to sink current from the bitline, and second control terminal coupled to the memory cell robustness assessment unit.

10. The memory device of claim 9, wherein the memory cell robustness assessment unit comprises:
a first latch stage having a first latch input and a first latch output, the first latch input coupled to the output terminal of the sense amplifier;
a second latch stage having a second latch input and a second latch output, the second latch input coupled to the first latch output; and
a logic block including a first logic input, a second logic input, and a logic output, the first logic input coupled to the first latch output, the second logic input coupled to the second latch output, and the logic output to provide a signal indicative of a robustness of the memory cell.

11. The memory device of claim 10, further comprising:
a fastest-bit detection circuit having a detection input and a detection output, the detection input coupled to the first latch output and the detection output coupled to a clock terminal of the first latch stage via a connection.

12. The memory device of claim 9, wherein the memory cell robustness assessment unit is configured to perform a first stage of a robustness assessment read operation by carrying out a first read operation on a plurality of memory cells of the memory device with a first current level from the variable current source, and is further configured to during perform a second stage of the robustness assessment read operation by carrying out a second read operation on the plurality of memory cells of the memory device by using a second current level for some memory cells that are in a first data state and by using a third current level for other memory cells that are in a second data state.

13. The memory device of claim 12, wherein the first current level is substantially zero, and the second current level is a positive current and the third current level is a negative current.

14. The memory device of claim 12, wherein the first stage of the robustness assessment read operation corresponds to only a fastest subset of read operations for the plurality of memory cells.

15. A memory device, comprising
a plurality of memory cells;
a plurality of sense amplifiers, each sense amplifier comprising a first input terminal, a second input terminal, and an output terminal;
a plurality of bitlines coupling the plurality of memory cells, respectively, to the first input terminals of the plurality of sense amplifiers, respectively;
a plurality of reference bitlines coupled to the second terminals of the plurality of sense amplifiers, respectively;
a plurality of variable current sources coupled to the plurality of bitlines, respectively; and
a memory cell robustness assessment unit having a plurality of inputs and a plurality of outputs, the plurality of inputs of the memory cell robustness assessment unit coupled to the output terminals of the plurality of sense amplifiers, respectively, and the plurality of outputs of the memory cell robustness assessment unit coupled to control terminals of the plurality of variable current sources, respectively;
wherein the memory cell robustness assessment unit comprises:
a first latch stage having a plurality of first latch inputs and a plurality of first latch outputs, the first latch inputs coupled to output terminals of the plurality of sense amplifiers, respectively;
a second latch stage having a plurality of second latch inputs and a plurality of second latch outputs, the second latch inputs coupled to the first latch outputs, respectively; and
a plurality of logic blocks each including a first logic input, a second logic input, and a logic output; the first logic inputs coupled to the first latch outputs, respectively, and the second logic inputs coupled to the second latch outputs, respectively.

16. The memory device of claim 15, wherein the plurality of logic blocks each include an exclusive-or gate.

17. The memory device of claim 15, further comprising:
an OR-gate having inputs respectively coupled to the logics outputs of the plurality of logic blocks, and configured to output a signal indicative of the robustness of the memory device.

* * * * *